United States Patent
Suh

(10) Patent No.: US 8,884,494 B2
(45) Date of Patent: Nov. 11, 2014

(54) SLIP-STICK PIEZOELECTRIC ACTUATOR

(71) Applicant: Samsung Electronics Co., Ltd., Suwon-si (KR)

(72) Inventor: Hwan-soo Suh, Gunpo-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/743,404

(22) Filed: Jan. 17, 2013

(65) Prior Publication Data

US 2013/0193804 A1 Aug. 1, 2013

(30) Foreign Application Priority Data

Jan. 31, 2012 (KR) ........................ 10-2012-0009740

(51) Int. Cl.
*H02N 2/02* (2006.01)
*H02N 2/04* (2006.01)
*H02N 2/10* (2006.01)
*H01L 41/09* (2006.01)
*H02N 2/00* (2006.01)

(52) U.S. Cl.
CPC ............... *H02N 2/043* (2013.01); *H02N 2/101* (2013.01); *H01L 41/0993* (2013.01); *H02N 2/0095* (2013.01); *H02N 2/025* (2013.01); *H02N 2/028* (2013.01); *H02N 2/02* (2013.01)
USPC .......................................... 310/333; 310/328

(58) Field of Classification Search
CPC ............. H02N 2/02; H02N 2/04; H02N 2/08; H02N 2/09; H02N 2/0906; H02N 2/0986
USPC .................. 310/323.02, 323.09, 328, 333
See application file for complete search history.

(56) References Cited

U.S. PATENT DOCUMENTS

| | | | | |
|---|---|---|---|---|
| 4,195,243 | A | * | 3/1980 | Thaxter .......................... 310/317 |
| 4,983,874 | A | * | 1/1991 | Yamaguchi ............... 310/323.06 |
| 5,939,816 | A | * | 8/1999 | Culp ............................. 310/328 |
| 6,278,221 | B1 | * | 8/2001 | Kasuga et al. ........... 310/323.09 |
| 2007/0085450 | A1 | * | 4/2007 | Hwang et al. .................. 310/328 |
| 2012/0081802 | A1 | * | 4/2012 | Kuwano et al. ................ 359/824 |

FOREIGN PATENT DOCUMENTS

| | | |
|---|---|---|
| KR | 10-0649635 B1 | 11/2006 |
| KR | 10-0965433 B1 | 6/2010 |
| KR | 10-1042203 B1 | 6/2011 |
| KR | 10-1045996 B1 | 7/2011 |
| WO | 9319494 A1 | 9/1993 |

* cited by examiner

*Primary Examiner* — Derek Rosenau
(74) *Attorney, Agent, or Firm* — Sughrue Mion, PLLC

(57) ABSTRACT

A piezoelectric actuator includes a fixed body, a movable body arranged to face the fixed body, and a plurality of piezoelectric elements arranged between the fixed body and the movable body and operating in a shearing mode. Each piezoelectric element having one end fixed to the fixed body and another end contacting the movable body, wherein a direction of polarization of each of the plurality of piezoelectric elements is different from each other.

20 Claims, 18 Drawing Sheets

SLIP-STICK PIEZOELECTRIC ACTUATOR

CROSS-REFERENCE TO RELATED APPLICATIONS

This application claims the benefit of Korean Patent Application No. 10-2012-0009740, filed on Jan. 31, 2012, in the Korean Intellectual Property Office, the disclosure of which is incorporated herein by reference, in its entirety.

BACKGROUND

1. Field

The present disclosure relates to a piezoelectric actuator that is driven as a slip-stick piezoelectric actuator by using a piezoelectric effect of a piezoelectric element.

2. Description of the Related Art

In scanning probe microscopy (SPM), optical equipment, semiconductor processing equipment, high precision aligners, etc., an object may be moved in a range from several millimeters to several centimeters. Accordingly, there is a demand for a positioner capable of precisely moving an object at a level in which a movement distance of one step is less than several micrometers, for example, from tens of nanometers to several picometers. Thus, there is a demand for developing a piezoelectric actuator having a simple structure which is capable of generating a fine displacement of an object.

SUMMARY

A slip-stick piezoelectric actuator is provided with a small and simple structure that may move an object with a degree of freedom over two dimensions.

Additional aspects will be set forth in part in the description which follows and, in part, will be apparent from the description, or may be learned by practice of the exemplary embodiments of the inventive concept.

According to an aspect of the present inventive concept, a piezoelectric actuator includes a fixed body, a movable body arranged to face the fixed body, and a plurality of piezoelectric elements arranged between the fixed body and the movable body and which operate in a shearing mode, each piezoelectric element having one end fixed to the fixed body and another end contacting the movable body, wherein a direction of polarization of each of the plurality of piezoelectric element is different from each other.

Each of the plurality of piezoelectric elements may include a first piezoelectric layer and a second piezoelectric layer having opposite directions of polarization.

The first and second piezoelectric layers may be stacked on each other.

The piezoelectric actuator may further include an elastic member having one end which contacts the fixed body and another end which elastically presses the movable body against the plurality of piezoelectric elements.

A magnet may be arranged on at least one of the movable body and the fixed body, and the movable body may press against the plurality of piezoelectric elements due to a magnetic force of the magnet.

The piezoelectric actuator may have a translational motion through a slip-stick operation between the plurality of piezoelectric elements and the movable body.

The number of piezoelectric elements may be three or more, and the direction of polarization may extend in a radial direction or in a direction perpendicular to the radial direction.

A surface of the movable body which contacts the plurality of piezoelectric elements may be a curved surface, and the movable body may have a tilt motion from the plurality of piezoelectric elements.

The piezoelectric actuator may further include a support portion which supports the plurality of piezoelectric elements in a direction which is tangential of the curved surface.

The piezoelectric actuator may further include a displacement detector which detects a displacement of the movable body.

The displacement detector may include a plurality of electrodes arranged on surfaces of the movable body and the fixed body facing each other, and for detecting a change in capacitance between the plurality of electrodes according to a change in a placement of the movable body.

According to another aspect of the present inventive concept, a piezoelectric actuator includes a fixed body, a movable body arranged to face the fixed body, and at least one piezoelectric element arranged between the fixed body and the movable body and operating in a shearing mode, the piezoelectric element having one end fixed to the fixed body and another end contacting the movable body, wherein each of the at least one piezoelectric element comprises first and second piezoelectric devices, and wherein a direction of polarization of the first piezoelectric device and a direction of polarization the second piezoelectric device are different from each other.

At least one of the first and second piezoelectric devices may include a first piezoelectric layer and a second piezoelectric layer which have opposite directions of polarization.

The first and second piezoelectric layers may be stacked upon each other.

A direction of polarization of the first piezoelectric device and a direction of polarization of the second piezoelectric device may be perpendicular to each other.

The first and second piezoelectric devices may be stacked upon each other.

The movable body may be pressed against the at least one piezoelectric element by at least one of: self-weight; an elastic force, and a magnetic force.

A surface of the movable body which contacts the at least one piezoelectric element may be a flat surface.

The piezoelectric actuator may be capable of having a translational motion and a rotational motion by a slip-stick operation between the at least one piezoelectric element and the movable body.

A surface of the movable body which contacts the at least one piezoelectric element may be a curved surface, and the movable body may have a tilt motion from the at least one piezoelectric element.

A support portion which supports the at least one piezoelectric element in a tangential direction of the curved surface may be provided on the fixed body.

The piezoelectric actuator may further include a displacement detector which detects a displacement of the movable body, wherein the displacement detector includes a plurality of electrodes arranged on surfaces of the movable body and the fixed body which face each other.

According to another aspect of the present inventive concept, a piezoelectric actuator includes a fixed body, a movable body arranged to face the fixed body, a plurality of piezoelectric elements arranged between the fixed body and the movable body and operating in a shearing mode, each piezoelectric element having one end fixed to the fixed body and another end which contacts the movable body, wherein a direction of polarization of each of the plurality of piezoelectric elements is different from each other, each of the plurality of piezoelectric elements comprises a first piezoelectric layer and a second piezoelectric layer, a direction of polarization of the first piezoelectric layer and a direction of polarization of the second piezoelectric layer are perpendicular to each other, and at least one of the fixed body and the movable body comprises a through portion.

One of a direction of polarization of the first piezoelectric layer and a direction of polarization of the second piezoelectric layer may extend in a radial direction or in a direction perpendicular to the radial direction.

The piezoelectric actuator may have a translational motion by a slip-stick operation between the plurality of piezoelectric elements and the movable body.

The movable body may be pressed against the plurality of piezoelectric elements by at least one of: self-weight; an elastic force, and a magnetic force.

The piezoelectric actuator may further include a displacement detector which detects a displacement of the movable body, wherein the displacement detector comprises a plurality of electrodes arranged on surfaces of the movable body and the fixed body which face each other.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
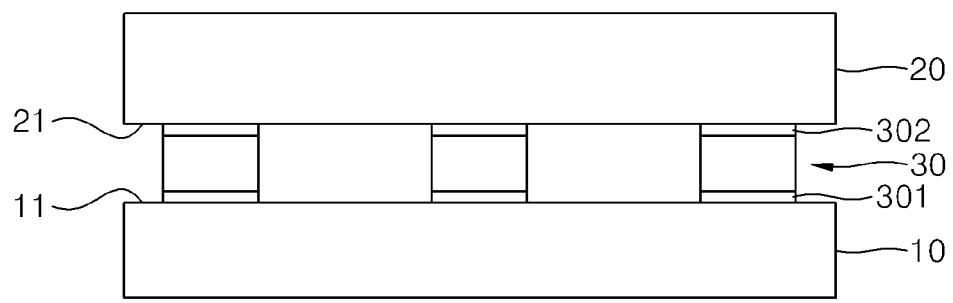
FIG. 1 is a side view schematically illustrating a slip-stick piezoelectric actuator that allows a movable body to have a translational motion, according to an exemplary embodiment of the present inventive concept.

Reference will now be made in detail to the exemplary embodiments, examples of which are illustrated in the accompanying drawings, wherein like reference numerals refer to the like elements throughout. In this regard, the exemplary embodiments may have different forms and should not be construed as being limited to the descriptions set forth herein. Accordingly, the exemplary embodiments are merely described below, by referring to the figures, to explain aspects of the present inventive concept. As used herein, the term "and/or" includes any and all combinations of one or more of the associated listed items. Expressions such as "at least one of," when preceding a list of elements, modifies the entire list of elements and does not modify the individual elements of the list.

Figure 2:
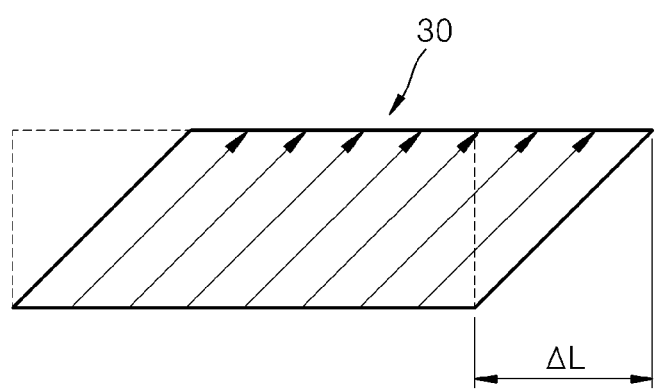
FIG. 2 illustrates a shearing displacement of a piezoelectric element acting in a shearing mode.

FIG. 1 is a side view schematically illustrating a slip-stick piezoelectric actuator that allows an object to have a translational motion, according to an exemplary embodiment of the present inventive concept. FIG. 2 illustrates a shearing displacement of a piezoelectric element acting in a shearing mode. FIG. 1 illustrates a fixed body 10, a movable body 20, and a plurality of piezoelectric elements 30.

The fixed body 10 and the movable body 20 are arranged in a manner separated from each other and facing each other. The piezoelectric elements 30 are arranged between two surfaces 11 and 21, respectively, of the fixed body 10 and the movable body 20 which face each other. Each of the piezoelectric elements 30 includes a fixed end 301 fixed to the fixed body 10 and a movable end 302 frictionally contacting the movable body 20. The fixed end 301 is fixed to the surface 11 of the fixed body 10, whereas the movable end 302 frictionally contacts the surface 21 of the movable body 20. For example, the piezoelectric elements 30 may adhere to the surface 11 of the fixed body 10 via an adhesive. Also, the adhesive may include, for example, an epoxy-based adhesive or a solvent vaporization type adhesive.

The piezoelectric elements 30 according to the exemplary embodiment act in a shearing mode as illustrated in FIG. 2. In FIG. 2, a dotted line indicates the piezoelectric elements 30 before a drive voltage is applied thereto and a solid line indicates the piezoelectric elements 30 after the drive voltage is applied thereto to shear-deform the piezoelectric elements 30. A displacement $\Delta L$ of the piezoelectric elements 30 when the piezoelectric elements 30 act in a shearing mode may be expressed as follows by a voltage V applied to the piezoelectric elements 30 and a piezoelectric constant $d_{15}$ of a shearing mode.

$$\Delta L \approx d_{15} \times V$$

The piezoelectric constant $d_{15}$ of a shearing mode is greater than piezoelectric constants $d_{31}$ and $d_{33}$ respectively of a transverse mode and a longitudinal mode. For example, for a lead zirconate titanate (PZT), the piezoelectric constants $d_{31}$, $d_{33}$, and $d_{15}$ of a longitudinal mode, a transverse mode, and a shearing mode at room temperature are 200~700, −60~−350, and 300~800 pico-meter/V, respectively, in which the piezoelectric constant $d_{15}$ of a shearing mode is the highest of them. Thus, when the piezoelectric elements 30 operate in a shearing mode, a large displacement may be generated at a relatively low voltage compared to a case when the piezoelectric elements 30 act in a transverse mode or a longitudinal mode.

Figure 3:
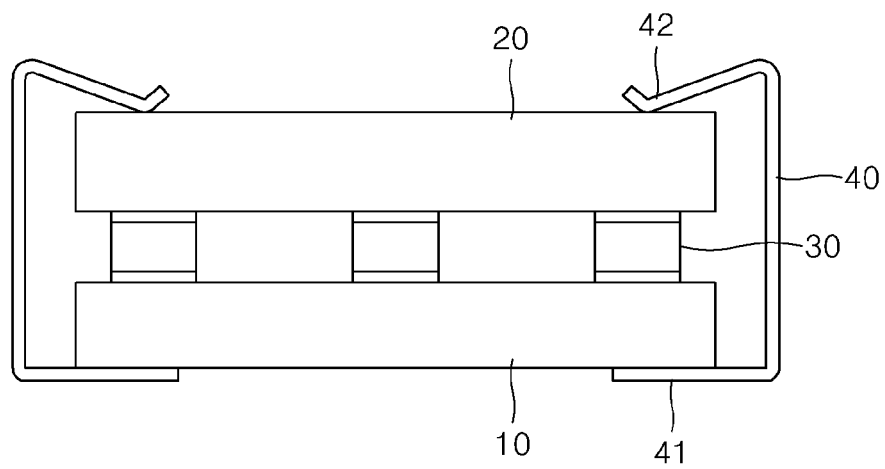
FIG. 3 is a side view illustrating a structure in which a movable body is pressed against a piezoelectric element by using an elastic member, according to an exemplary embodiment of the present inventive concept.

The movable body 20 applies a force to the piezoelectric elements 30 due to its weight and may frictionally contact the movable end 302. Also, as illustrated in FIG. 3, an elastic member 40 for pressing the movable body 20 against the piezoelectric elements 30 may be provided. The elastic member 40 may be, for example, a leaf spring having one end 41 fixed to the fixed body 10 and another end 42 elastically contacting the movable body 20. Also, the movable body 20 may be pressed against the piezoelectric elements 30 by a magnetic force.

Figure 4:
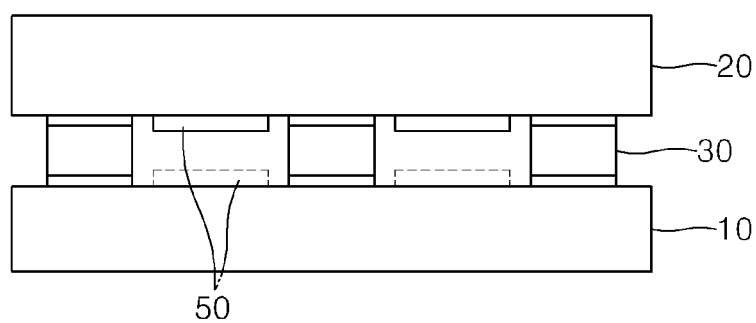
FIG. 4 is a side view illustrating a structure in which a movable body is pressed against a piezoelectric element by using a magnet, according to an exemplary embodiment of the present inventive concept.

Referring to FIG. 4, when the fixed body 10 is formed of a magnetic material, a magnet 50 is arranged on the movable body 20 to press the movable body 20 against the piezoelectric elements 30 by a magnetic attraction with the fixed body 10. When the magnet 50 is arranged on the fixed body 10, the movable body 20 is formed of a magnetic material and the magnet 50 attracts the movable body 20 to press the movable body 20 against the piezoelectric elements 30. Also, when the magnet 50 is provided on each of the movable body 20 and the fixed body 10, the movable body 20 may be pressed against the piezoelectric elements 30 due to mutual magnetic attraction therebetween.

Figure 5:
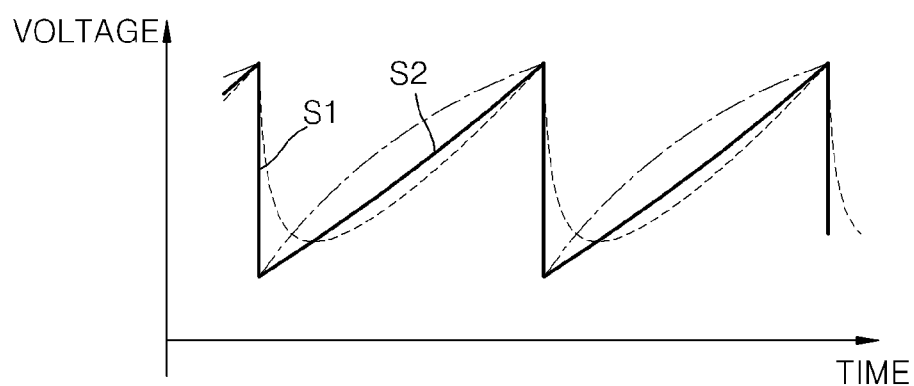
FIG. 5 is a graph showing an example of a drive signal for slip-stick driving.

In the piezoelectric actuator according to the exemplary embodiment, the movable body 20 is moved by a combination of a slip-stick motion of the piezoelectric elements 30. FIG. 5 is a graph showing an example of a drive signal for driving the piezoelectric elements 30. The drive signal shown in FIG. 5 has a sawtooth waveform. The drive signal includes a section S1 in which a voltage is sharply changed and a section S2 in which the voltage is gradually changed.

Figure 6:
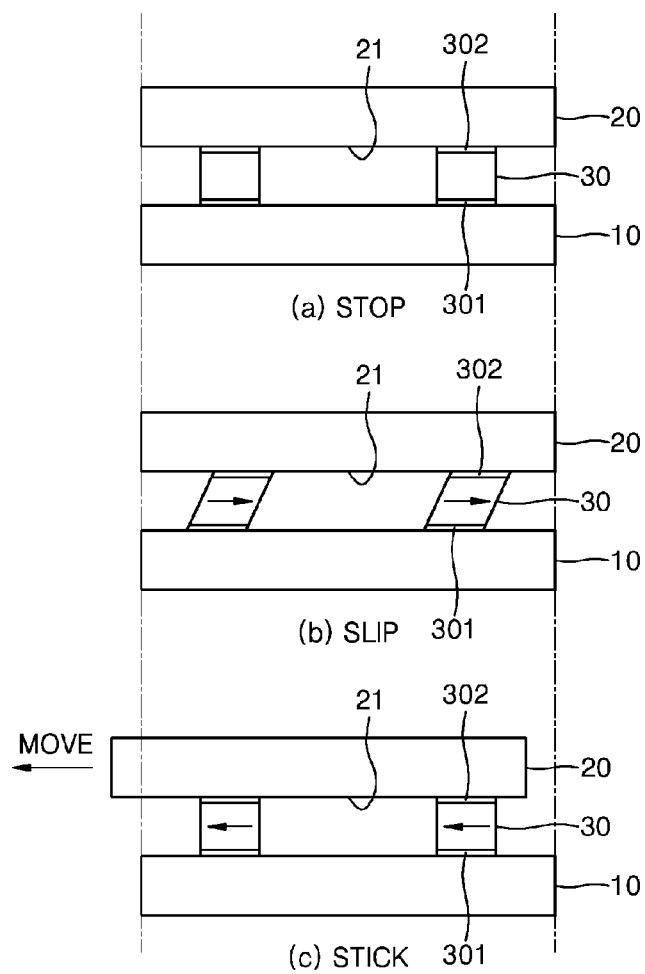
FIGS. 6a, 6b and 6c illustrate a slip-stick driving process.

FIGS. 6A to 6C illustrate a movement of the piezoelectric elements 30 when the drive signal of FIG. 5 is applied to the piezoelectric elements 30. FIG. 6A illustrates a state in which a drive signal is not applied. In this state, when the section S1 of the drive signal is applied, the piezoelectric elements 30 are deformed to a shearing mode as illustrated in FIG. 2. If the deformation of the piezoelectric elements 30 due to a change in the voltage of the drive signal is generated quickly enough to overcome the inertia of the movable body 20 and the pressure applied to the movable body 20 and the fixed body 10, the movable end 302 of the piezoelectric elements 30 slips over the surface 21 of the movable body 20 and thus the piezoelectric elements 30 may be deformed, as illustrated in FIG. 6B. In doing so, the movable body 20 is not moved. A section where the movable end 302 of the piezoelectric elements 30 is deformed while slipping over the movable body 20 is a slip section that corresponds to the section S1 of the drive signal. Next, when the section S2 of the drive signal is applied to the piezoelectric elements 30, the piezoelectric elements 30 are gradually returned to their original state. Since the movable end 302 of the piezoelectric elements 30 is in a state of being pressed against the surface 21 of the movable body 20, the movable end 302 is returned to its original state and the movable body 20 is moved in a predetermined direction. Thus, as illustrated in FIG. 6C, the movable body 20 is moved to the left side on the drawing sheet. A section where the piezoelectric elements 30 are returned to their original state from the deformed state and the movable body 20 is moved with the movable end 302 is a stick section that corresponds to the section S2 of the drive signal. As described above, as slip-stick driving is repeated, the movable body 20 may be moved.

The shape of a drive signal for slip-stick driving is not limited to the shape of a sawtooth. A drive signal may have any shape if it has a section with a sharply changing voltage inclination and a section with a gradually changing voltage inclination. For example, a cycloidal wave signal as illustrated by a dotted line in FIG. 5, a clipped sinusoidal wave signal as illustrated by a dashed-dotted line in FIG. 5, etc., may be used as a drive signal.

Figure 7:
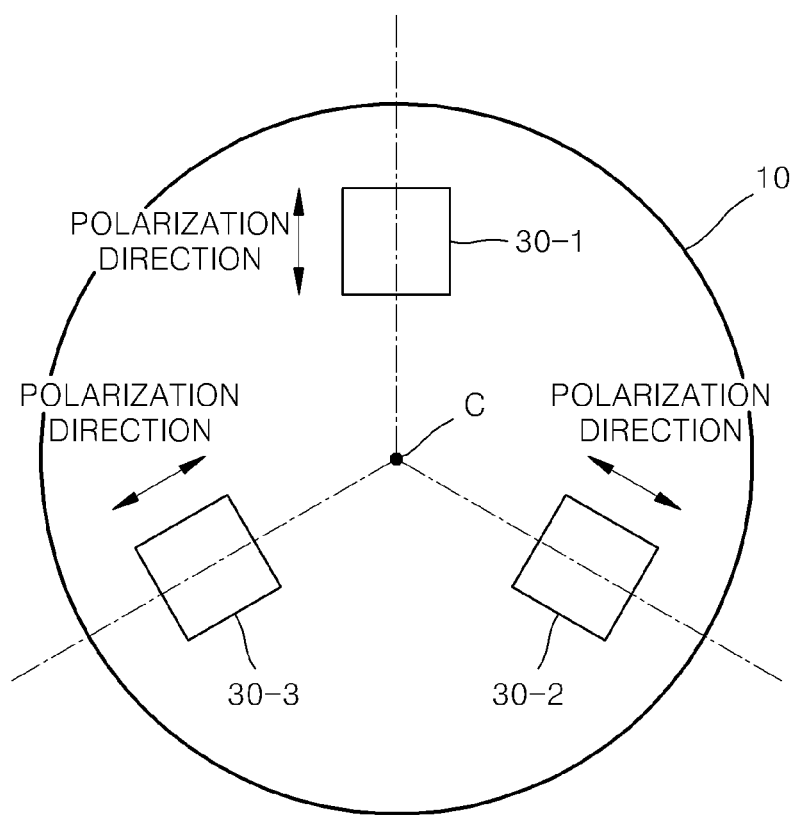
FIG. 7 is a plan view illustrating an arrangement of a plurality of piezoelectric elements in the piezoelectric actuator of FIG. 1, according to an exemplary embodiment of the present inventive concept.

The piezoelectric actuator in the exemplary embodiment may allow the movable body 20 to have a translational motion within a 2-dimensional plane. To this end, the piezoelectric elements 30 are radially arranged. For example, as illustrated in FIG. 7, three piezoelectric elements 30-1, 30-2, and 30-3 are radially arranged with respect to a center point C. Although in the exemplary embodiment each of the three piezoelectric elements 30-1, 30-2, and 30-3 are arranged at an interval of 120° around the center point C, the present inventive concept is not limited thereto. Four or more piezoelectric elements 30 may be arranged as necessary. The distance between the center point C and each of the piezoelectric elements 30-1, 30-2, and 30-3 may not be the same. Also, the three piezoelectric elements 30-1, 30-2, and 30-3 may not necessarily be arranged to be symmetrical. The number and arrangement of the piezoelectric elements 30 may be determined to be such as to be suitable for a required driving characteristic of the movable body 20. The directions of polarization of the three piezoelectric elements 30-1, 30-2, and 30-3 are different to one another in the embodiment of FIG. 7. For example, the directions of polarization of the three piezoelectric elements 30-1, 30-2, and 30-3 are radial and the three piezoelectric elements 30-1, 30-2, and 30-3 are arranged at an interval of 120°. In the following description, the direction of polarization has the same meaning as a direction of deformation of a piezoelectric element by a shearing mode.

Figure 8:
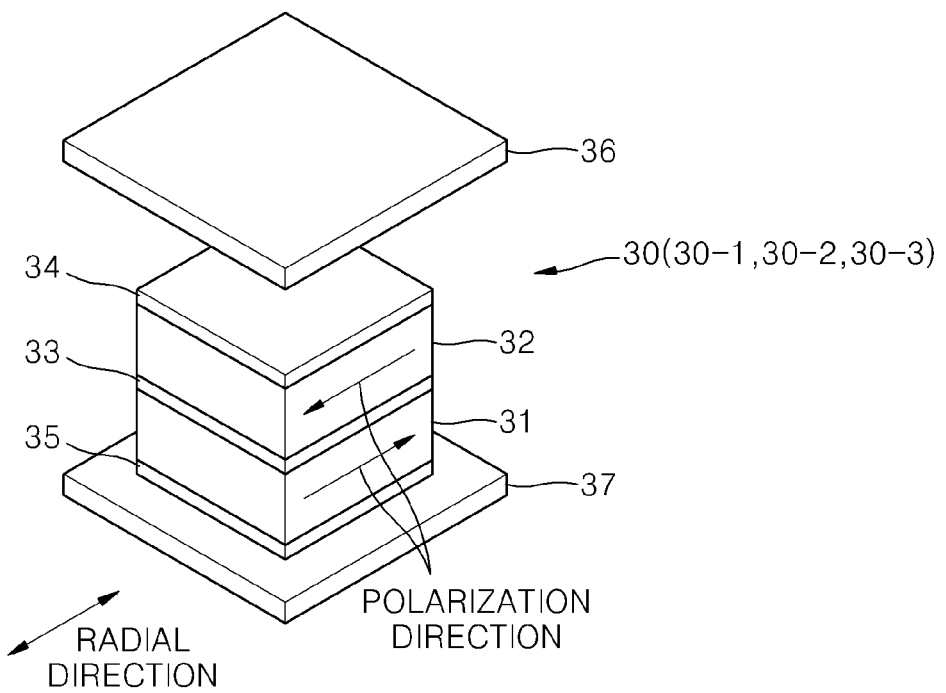
FIG. 8 is a perspective view of a piezoelectric element applied to the piezoelectric actuator of FIG. 1, according to an exemplary embodiment of the present inventive concept.

FIG. 8 is a perspective view of the piezoelectric elements 30 applied to the piezoelectric actuator of FIG. 1, according to an exemplary embodiment of the present inventive concept. Referring to FIG. 8, the piezoelectric elements 30 may include first and second piezoelectric layers 31 and 32 that are stacked. A common electrode 33 is arranged between the first and second piezoelectric layers 31 and 32. Drive electrodes 35 and 34 may be respectively arranged on a lower surface of the first piezoelectric layer 31 and an upper surface of the second piezoelectric layer 32. Terminal plates 36 and 37 may be respectively arranged on an upper surface of the drive electrode 34 and a lower surface of the drive electrode 35. The directions of polarization of the first and second piezoelectric layers 31 and 32 are opposite to each other. For example, the direction of polarization of the first piezoelectric layer 31 may be from the center point C to the outside, whereas the direction of polarization of the second piezoelectric layer 32 may be from the outside to the center point C. The terminal plate 37 is fixed to the surface 11 of the fixed body 10, whereas the terminal plate 36 may frictionally contact the surface 21 of the movable body 20.

The piezoelectric layers 31 and 32 may be formed by forming a shape through a well-known manufacturing process in the art, for example, a deposition process of a piezoelectric material or a method of sintering a piezoelectric material in a paste state to a predetermined thickness, for example, 0.5 mm to 1 mm, and performing a poling process to generate a piezoelectric characteristic. To operate the piezoelectric elements 30 in a shearing mode, an electric field may be applied to the piezoelectric elements 30 in a state in which stress in a shearing direction is applied to the piezoelectric layers 31 and 32 in the poling process. The piezoelectric layers 31 and 32 may be formed of a slice of a bulk piezoelectric material. A piezoelectric material may include a lead zirconate titanate (PZT), a ceramic material, $BaTiO_3$, $PbTiO_3$, $KNbO_3$, $LiNbO_3$, $LiTaO_3$, $Na_2WO_3$, $Zn_2O_3$, $Ba_2NaNb_5O_5$, $Pb_2KNb_5O_{15}$, $BiFeO_3$, $NaNbO_3$, $Bi_4Ti_3O_{12}$, $Na_{0.5}Bi_{0.5}TiO_3$, etc. The electrodes 33, 34, and 35 may be formed as a single metal layer or as two metal layers of, for example, a Ti layer and a Pt layer. The electrodes 33, 34, and 35 may be formed by screen-printing a conductive metal material, for example, an Ag—Pd paste, onto the piezoelectric layer 31 or the piezoelectric layer 32. However, the present inventive concept is not limited to the above process of forming the piezoelectric layers and the electrodes. For example, the piezoelectric layers 31 and 32 may be formed by cutting a piezoelectric material that is commercially available and poled in a shearing mode in a desired shape, as necessary. Also, a piezo-stack in which a plurality of thin film type piezoelectric layers are stacked may be employed as the piezoelectric layers 31 and 32.

Referring back to FIGS. 6A to 6C, it can be seen that the movable body 20 moves in a direction opposite to the direction of polarization of the piezoelectric elements 30. An example of a process to allow the movable body 20 to have a translational motion within a plane by using the above characteristic, is described below. In the following description, when a drive voltage is applied to the first piezoelectric layer 31 of the piezoelectric elements 30-1, 30-2, and 30-3, the directions of polarization of the piezoelectric elements 30-1, 30-2, and 30-3 are P1-1, P2-1, and P3-1, respectively. Also, when a drive voltage is applied to the second piezoelectric layer 32 of the piezoelectric elements 30-1, 30-2, and 30-3, the directions of polarization of the piezoelectric elements 30-1, 30-2, and 30-3 are P1-2, P2-2, and P3-2, respectively.

A drive signal is applied to the first piezoelectric layer 31 of the piezoelectric element 30-1 and the second piezoelectric layers 32 of the piezoelectric elements 30-2 and 30-3. Then, the piezoelectric elements 30-1, 30-2, and 30-3 are polarized in the directions P1-1, P2-1, and P3-2, as illustrated by a dotted line in FIG. 9. The movable body 20 is moved by a slip-stick operation in the opposite direction to the direction P1-1, that is, the direction P1-2, as indicated by the dotted line. To move the movable body 20 in the direction P1-1, a drive signal is applied to the second piezoelectric layer 32 of the piezoelectric element 30-1 and the first piezoelectric layers 31 of the piezoelectric elements 30-2 and 30-3. Then, the piezoelectric elements 30-1, 30-2, and 30-3 are polarized in the directions P1-2, P2-1, and P3-1, as illustrated by a dashed-dotted line in FIG. 9. The movable body 20 is moved by a slip-stick operation in the direction P1-1, as indicated by the dashed-dotted line.

Figure 10:
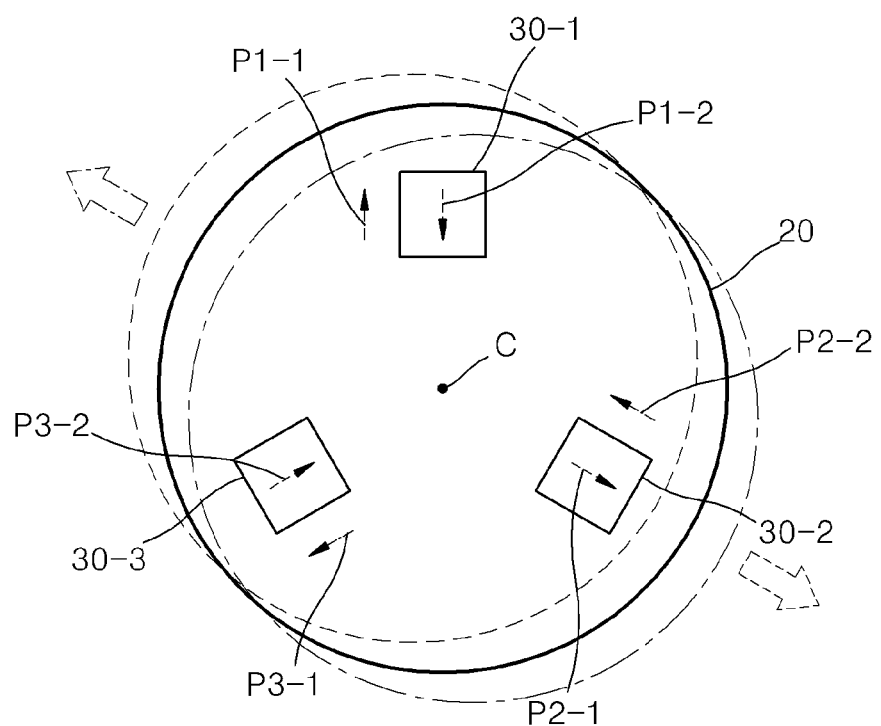

Referring to FIG. 10, when the piezoelectric elements 30-1, 30-2, and 30-3 are respectively polarized in the directions P1-2, P2-1, and P3-2, the movable body 20 is moved in the direction P2-2 as indicated by a dotted line. When the piezoelectric elements 30-1, 30-2, and 30-3 are respectively polarized in the directions P1-1, P2-2, and P3-1, the movable body 20 is moved in the direction P2-1 as indicated by a dashed-dotted line.

Figure 11:
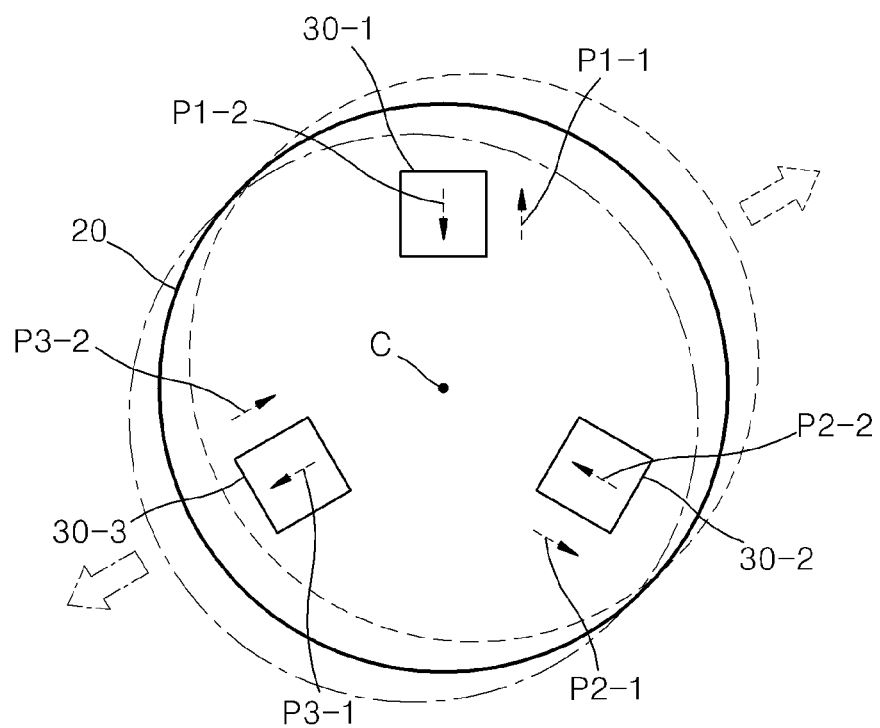

Similarly, referring to FIG. 11, when the piezoelectric elements 30-1, 30-2, and 30-3 are respectively polarized in the directions P1-2, P2-2, and P3-1, the movable body 20 is moved in the direction P3-2 as indicated by a dotted line. When the piezoelectric elements 30-1, 30-2, and 30-3 are respectively polarized in the directions P1-1, P2-1, and P3-2, the movable body 20 is moved in the direction P3-1 as indicated by a dashed-dotted line.

As described above, by combining the drive types of FIGS. 9, 10, and 11, the movable body 20 may have a translational motion to a certain position within a two-dimensional plane. Also, since the amount of deformation in a shearing mode of the piezoelectric layers 31 and 32 is proportional to the amount of a voltage of an applied drive signal, the movable body 20 may have a translational motion in a certain direction by differentiating the amount of a voltage of a drive signal applied to each of the piezoelectric elements 30-1, 30-2, and 30-3 in the combination of the drive types of FIGS. 9, 10, and 11.

Since an actuator using a piezoelectric phenomenon has characteristics which allow it to be precisely driven owing to a very small induced displacement for each unit voltage, the actuator can be controlled in a wide range of temperatures. A piezoelectric element in a fixed state exhibits a mechanical feature almost like a solid body structure a piezoelectric element can generate a very strong force within a small displacement, etc., a positioner using a piezoelectric phenomenon may be applied to scanning probe microscopy (SPM), optical equipment, semiconductor processing equipment, high precision aligners, etc. Since the piezoelectric actuator according to the present exemplary embodiment operates in a shearing mode, a displacement for each unit size of an applied drive voltage is relatively large compared to a case of operating in a traverse mode or a longitudinal mode. Thus, compared to a case of operating in a traverse mode or a longitudinal mode, the same displacement may be generated at a relatively low drive voltage.

The piezoelectric element 30 may be manufactured to have a very small size through slicing of a bulk piezoelectric material; a deposition process of a piezoelectric material, or a process of sintering a piezoelectric material in a paste state. Also, the piezoelectric actuator of the present exemplary embodiment may be embodied in a simple structure in which, for example, about three piezoelectric elements 30-1, 30-2, and 30-3 are radially arranged, and thus miniaturization of the piezoelectric actuator may be possible.

The piezoelectric actuator of the present exemplary embodiment may be applied to a positioner in a vertical direction for moving a probe from a surface of a test sample to a position separated by less than several micrometers in SPM. Also, a probe of SPM needs to be moved to another position in a horizontal direction because the size of a screen scanned by the probe is limited. Thus, the piezoelectric actuator of the present exemplary embodiment may be applied to a positioner in a horizontal direction. In addition, the piezoelectric actuator of the present embodiment may be applied to a lens actuator or an automatic focusing apparatus for fine adjustment of a focus in optical equipment.

Figure 9:
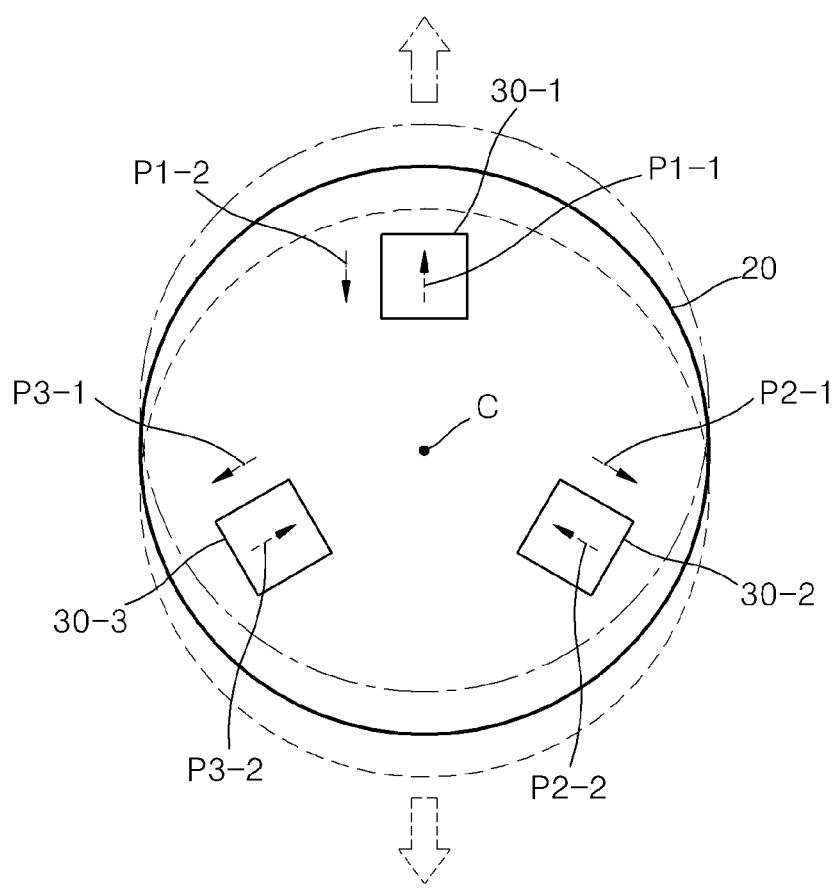
FIGS. 9 to 11 illustrate translational motions of a movable body in the piezoelectric actuator of FIG. 1, according to an exemplary embodiment of the present inventive concept.
Figure 12:
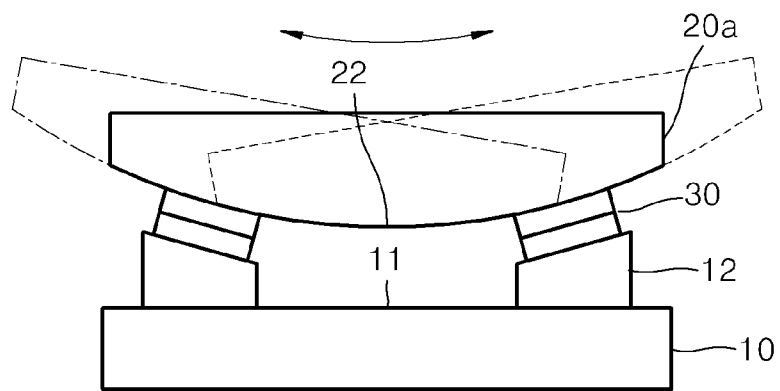
FIG. 12 is a side view illustrating a slip-stick piezoelectric actuator that allows a movable body to have a tilt motion, according to an exemplary embodiment of the present inventive concept.
Figure 13:
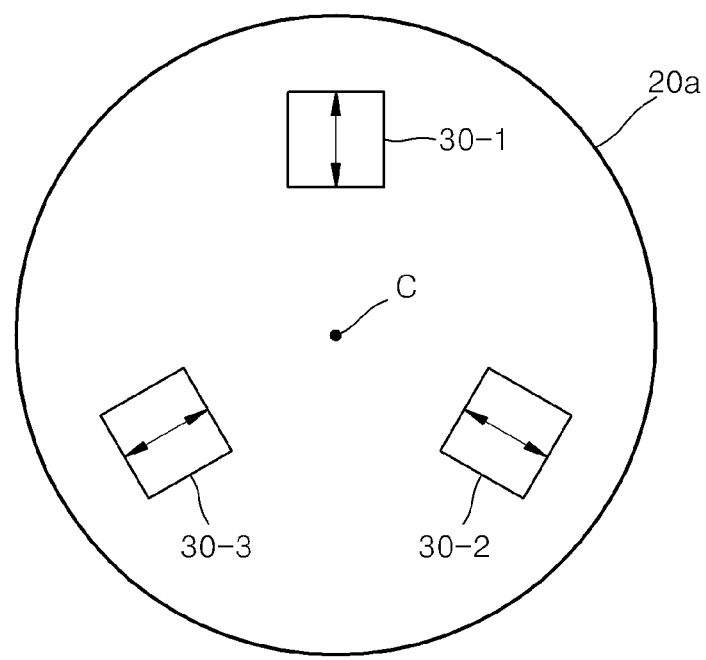
FIG. 13 is a plan view illustrating an arrangement of a plurality of piezoelectric elements in the piezoelectric actuator of FIG. 12, according to an exemplary embodiment of the present inventive concept.

The piezoelectric actuator may allow a movable body 20a to have a tilt motion. Referring to FIG. 12, a surface 22 of the movable body 20a frictionally contacting the piezoelectric elements 30 is a curved surface. Although the surface 22 is illustrated to be a convex curved surface in FIG. 12, the scope of the present inventive concept is not limited thereto. For example, the surface 22 may be a concave curved surface or any other type of a curved surface. The piezoelectric elements 30 are arranged to contact the surface 22 and to be inclined in a tangential direction of the surface 22. To this end, a support portion 12 for supporting the piezoelectric elements 30 to be inclined in a tangential direction to the surface 22 may be provided in the piezoelectric elements 30. For example, three piezoelectric elements 30-1, 30-2, and 30-3 may be radially arranged as illustrated in FIG. 13. The directions of polarization of the piezoelectric elements 30-1, 30-2, and 30-3 may be different from one another, for example, in radial directions. In the above structure, the movable body 20a may have a tilt motion in a certain direction as illustrated in FIG. 12 by controlling the directions of polarization of the piezoelectric elements 30-1, 30-2, and 30-3 and the voltage of a drive signal as illustrated in FIGS. 9 to 11. Accordingly, a goniometer may be embodied by employing a piezoelectric actuator having the above structure. The piezoelectric actuator having the above structure may be applied to control an angle of a reflection mirror or a direction of an optical fiber of a precision optical apparatus or an optical part operating in a vacuum environment.

Figure 14:
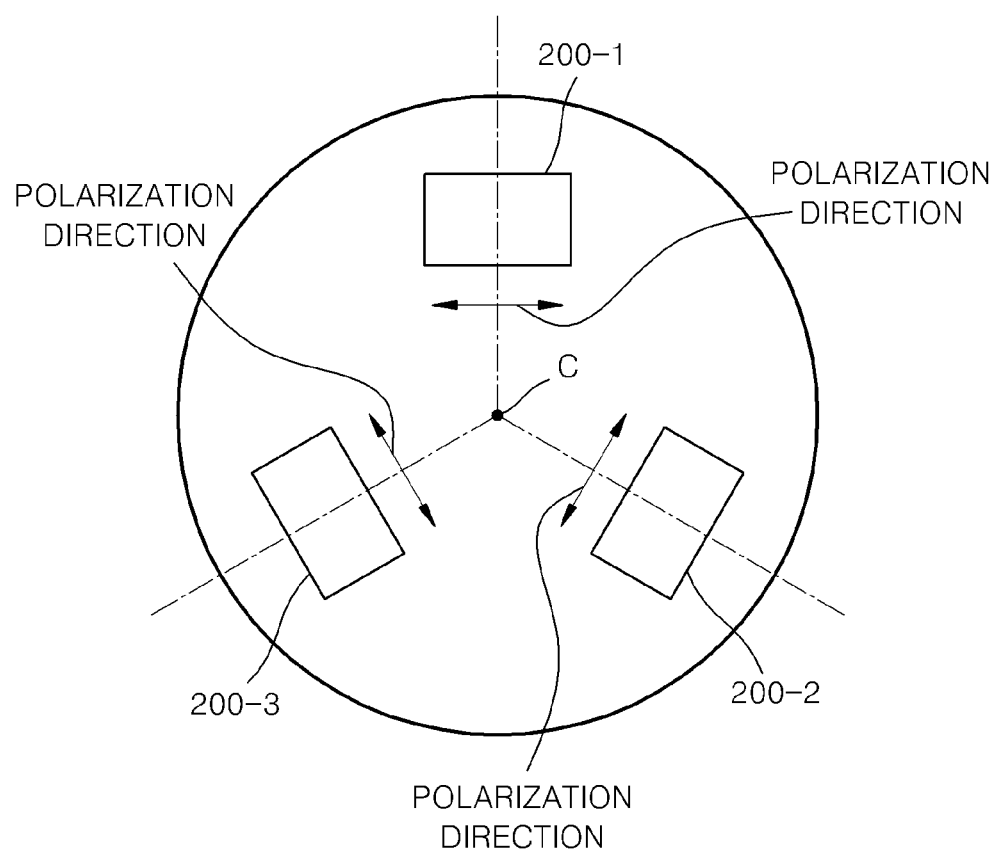
FIG. 14 is a plan view illustrating a slip-stick piezoelectric actuator that allows a movable body to have a rotational motion, according to an exemplary embodiment of the present inventive concept.

The piezoelectric actuator may allow the movable body 20 to have a rotational motion. Referring to FIG. 14, piezoelectric elements 200-1, 200-2, and 200-3 are radially arranged with respect to a center point C. The directions of polarization of the piezoelectric elements 200-1, 200-2, and 200-3 are perpendicular to radial directions. The piezoelectric actuator having the above structure is the same as the piezoelectric actuator for a translational motion of FIG. 8, except that the piezoelectric elements 30-1, 30-2, and 30-3 are arranged rotated by 90°. Thus, a description regarding detailed shapes of the piezoelectric elements 200-1, 200-2, and 200-3 is omitted herein.

When the movable body 20 is to be rotated in one direction only, the piezoelectric elements 200-1, 200-2, and 200-3 each include only one of the first and second piezoelectric layers 31 and 32. When the movable body 20 is to be rotated in both directions, the piezoelectric elements 200-1, 200-2, and 200-3 each include both of the first and second piezoelectric layers 31 and 32. In the present exemplary embodiment, the piezoelectric elements 200-1, 200-2, and 200-3 include both of the first and second piezoelectric layers 31 and 32 so as to rotate the movable body 20 in both directions. In the following description, when a drive voltage is applied, respectively, to the first piezoelectric layer 31 of each of the piezoelectric elements 200-1, 200-2, and 200-3, the directions of polarization of the piezoelectric elements 200-1, 200-2, and 200-3 are R1-1, R2-1, and R3-1. When a drive voltage is applied to the second piezoelectric layer 32 of each of the piezoelectric elements 200-1, 200-2, and 200-3, the directions of polarization of the piezoelectric elements 200-1, 200-2, and 200-3 are R1-2, R2-2, and R3-2, respectively.

Figure 15:
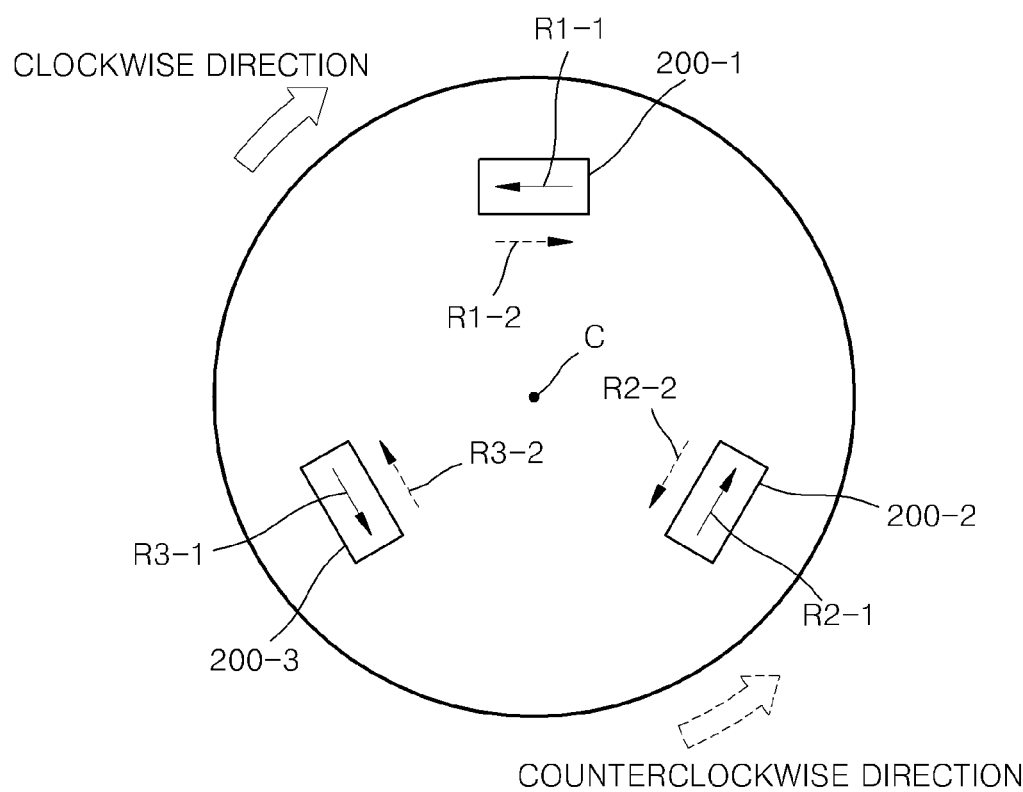
FIG. 15 illustrates a rotational motion of a movable body in the piezoelectric actuator of FIG. 14, according to an exemplary embodiment of the present inventive concept.

Referring to FIG. 15, a drive signal is applied to the first piezoelectric layer 31 of each of the piezoelectric elements 200-1, 200-2, and 200-3. Then, the piezoelectric elements 200-1, 200-2, and 200-3 are polarized in the directions R1-1, R2-1, and R3-1 as indicated by solid lines. As a result, the movable body 20 is rotated in the direction opposite to the directions of polarization of the piezoelectric elements 200-1, 200-2, and 200-3, that is, in a clockwise direction, due to a slip-stick operation. In contrast, when a drive signal is applied to the second piezoelectric layer 32 of each of the piezoelectric elements 200-1, 200-2, and 200-3, the piezoelectric elements 200-1, 200-2, and 200-3 are polarized in the directions R1-2, R2-2, and R3-2 as indicated by dotted lines. As a result, the movable body 20 is rotated in the direction opposite to the directions of polarization of the piezoelectric elements 200-1, 200-2, and 200-3, that is, in a counterclockwise direction. Thus, a piezoelectric actuator having a very simple structure capable of rotating the movable body 20 may be embodied according to the above structure.

In the above-described exemplary embodiments, although the first and second piezoelectric layers 31 and 32 each are illustrated as a single piezoelectric material layer, the present inventive concept is not limited thereto. Alternatively, the first and second piezoelectric layers 31 and 32 each may be a multilayer structure including a plurality of piezoelectric material layers having the same direction of polarization.

Figure 16:
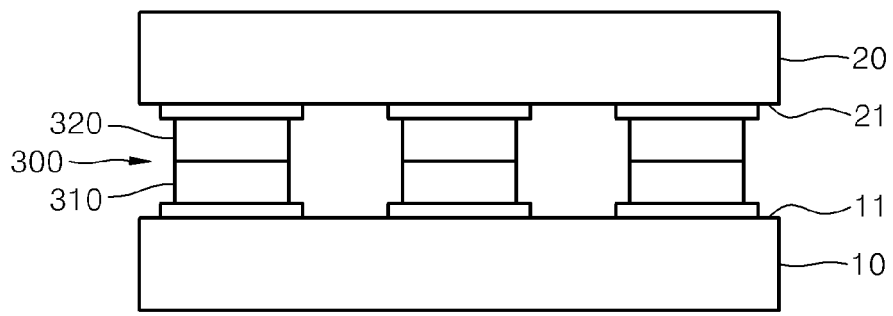
FIG. 16 is a side view illustrating a slip-stick piezoelectric actuator that allows a movable body to have a translational/rotational motion, according to an exemplary embodiment of the present inventive concept
Figure 17:
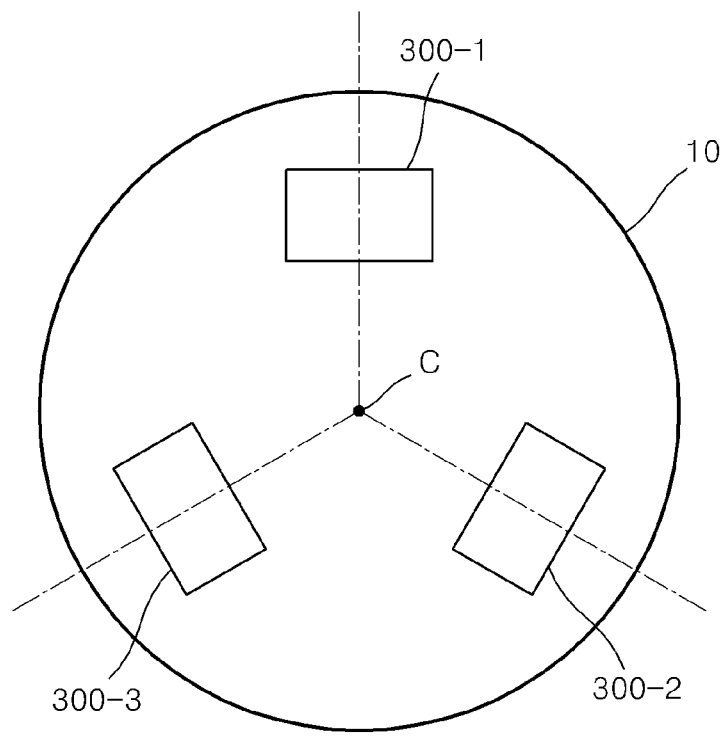
FIG. 17 is a plan view illustrating an arrangement of a plurality of piezoelectric elements in the piezoelectric actuator of FIG. 16, according to an exemplary embodiment of the present inventive concept.
Figure 18:
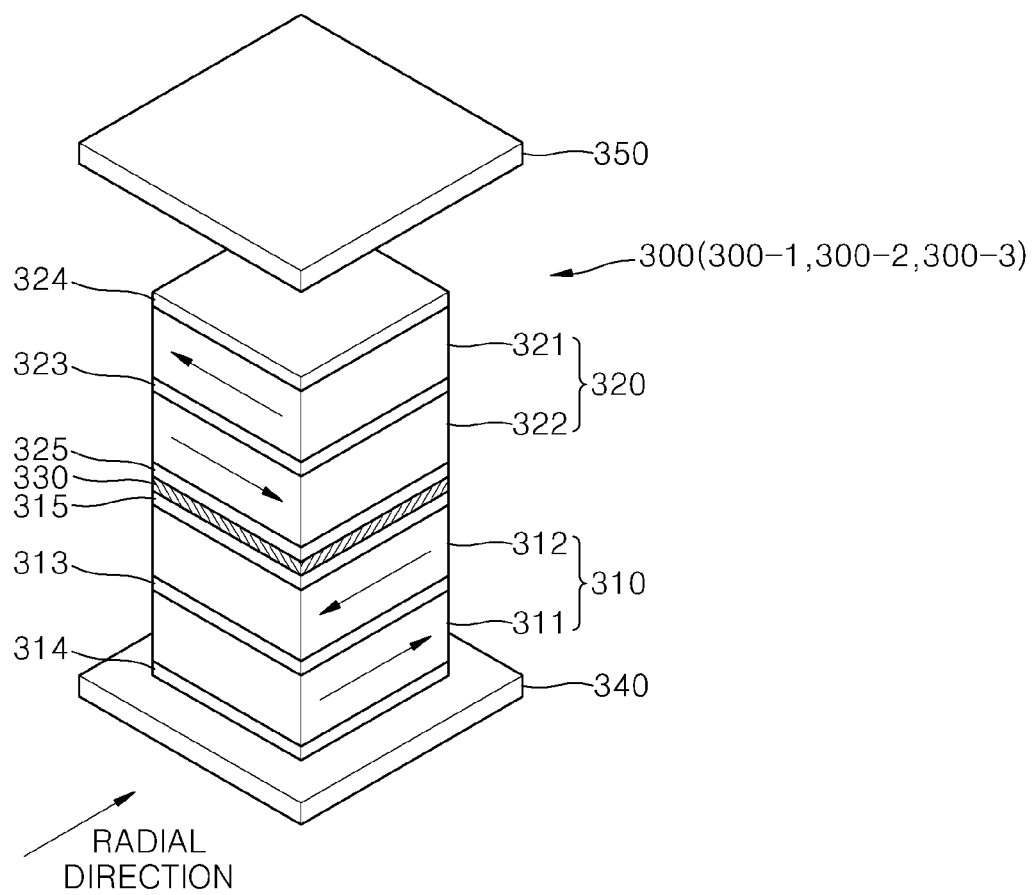
FIG. 18 is a perspective view of a piezoelectric element applied to the piezoelectric actuator of FIG. 16, according to an exemplary embodiment of the present inventive concept.

FIGS. 16 and 17 are a side view and a plan view of a piezoelectric actuator according to another exemplary embodiment of the present inventive concept. FIG. 18 is a perspective view of a piezoelectric element 300 of FIGS. 16 and 17 according to an exemplary embodiment of the present inventive concept. The piezoelectric actuator of FIGS. 16 and 17 is configured to allow the movable body 20 to have translational and rotational motions.

Referring to FIGS. 16 to 18, three piezoelectric elements 300-1, 300-2, and 300-3 are radially arranged with respect to a center point C. Although the three piezoelectric elements 300-1, 300-2, and 300-3 are illustrated to be arranged at an interval of 120° with respect to the center point C in the present exemplary embodiment, the scope of the present inventive concept is not limited thereto. Four or more piezoelectric elements 300 may be arranged, if necessary. Also, the distance from the center point C to each of the piezoelectric elements 300-1, 300-2, and 300-3 need not be the same. Furthermore, the three piezoelectric elements 300-1, 300-2, and 300-3 do not need to be symmetrically arranged. The number and arrangement of the piezoelectric element 300 may be determined to be such as to be suitable for any required drive characteristic of the movable body 20.

The piezoelectric element 300 has a structure in which a first piezoelectric device 310 and a second piezoelectric device 320 operating in a shearing mode and having directions of polarization perpendicular to each other are stacked. The first piezoelectric device 310 may include first and second piezoelectric layers 311 and 312 stacked on each other. A common electrode 313 may be arranged between the first and second piezoelectric layers 311 and 312. Drive electrodes 314 and 315 may be arranged on a lower surface of the first piezoelectric layer 311 and an upper surface of the second piezoelectric layer 312, respectively. The second piezoelectric device 320 may include third and fourth piezoelectric layers 321 and 322 stacked on each other. A common electrode 323 may be arranged between the third and fourth piezoelectric layers 321 and 322. Drive electrodes 324 and 325 may respectively be arranged on an upper surface of the third piezoelectric layer 321 and a lower surface of the fourth piezoelectric layer 322. An insulation layer 330 may be provided between the drive electrodes 315 and 325. Terminal plates 350 and 340 are respectively arranged on an upper surface of the drive electrode 324 and a lower surface of the drive electrode 314.

The direction of polarization of the first piezoelectric device 310 extends in a radial direction. Also, the directions of polarization of the first and second piezoelectric layers 311 and 312 are opposite to each other. For example, the direction of polarization of the first piezoelectric layer 311 may be from the center point C to the outside, whereas the direction of polarization of the second piezoelectric layer 312 may be from the outside to the center point C. The terminal plate 340 is fixed to the surface 11 of the fixed body 10.

The directions of polarization of the first and second piezoelectric devices 310 and 320 are perpendicular to each other as illustrated in FIG. 18. That is, the direction of polarization of the second piezoelectric device 320 is perpendicular to the radial direction. The directions of polarization of the third and fourth piezoelectric layers 321 and 322 are opposite to each other. For example, the direction of polarization of the third piezoelectric layer 321 is a counterclockwise direction with respect to the center point C; whereas the direction of polarization of the fourth piezoelectric layer 322 is a clockwise direction. The terminal plate 350 frictionally contacts the surface 21 of the movable body 20.

The movable body 20 may have a translational motion by driving the first piezoelectric device 310. A detailed translational motion driving process is the same as that described with reference to FIGS. 9 to 11. That is, since the piezoelectric elements 300-1, 300-2, and 300-3 respectively correspond to the piezoelectric elements 30-1, 30-2, and 30-3 of FIGS. 9 to 11, a redundant description thereof is omitted herein.

Also, the movable body 20 may have a rotational motion by driving the second piezoelectric device 320. A detailed rotational motion driving process is the same as that described with reference to FIG. 15. That is, since the piezoelectric elements 300-1, 300-2, and 300-3 respectively correspond to the piezoelectric elements 200-1, 200-2, and 200-3 of FIG. 15, a redundant description thereof is omitted herein.

Also, when the movable body 20 is replaced by the movable body 20a having the curved surface 22 of FIG. 12, the movable body 20a may have a tilt motion by driving the first piezoelectric device 310.

According to the above-described structure, a piezoelectric actuator capable of allowing the movable body 20 to have a translational/rotational motion and a tilt motion may be embodied.

Although the first to fourth piezoelectric layers 311, 312, 321, and 322 each are illustrated to be a single piezoelectric material layer in the above-described embodiments, the scope of the present inventive concept is not limited thereto. Each of the first to fourth piezoelectric layers 311, 312, 321, and 322 may have a structure in which a plurality of piezoelectric material layers having the same direction of polarization are stacked.

Figure 19:
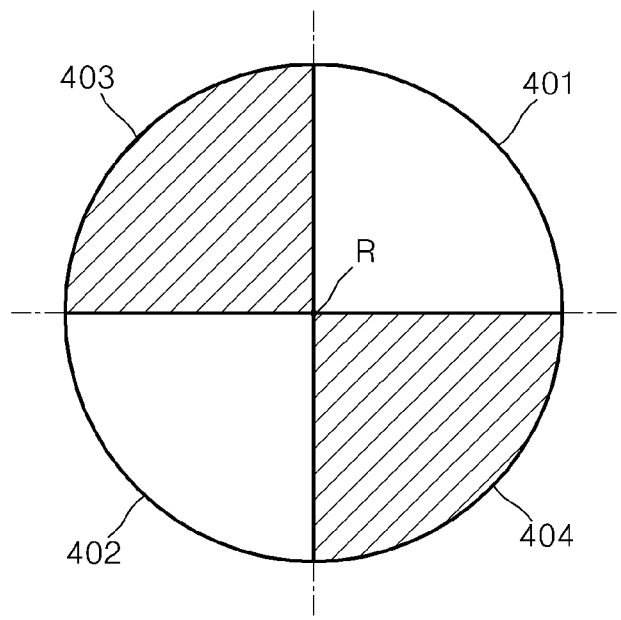
FIG. 19 illustrates a structure of a displacement detector which detects a translational displacement of a movable body.

A translational displacement detector which detects a displacement of a translational motion of the movable body 20 may be provided in the piezoelectric actuator capable of allowing the movable body 20 of FIG. 7 to have a translational motion. For example, the translational displacement detector may detect a displacement of a translational motion of the movable body 20 by a capacitance method based on a change in the capacitance between a plurality of opposed electrodes provided on the movable body 20 and the fixed body 10. FIG. 19 illustrates an example of a translational displacement detector in a capacitance method. Referring to FIG. 19, first and second electrodes 401 and 402 may be provided on the fixed body 10, whereas third and fourth electrodes 403 and 404 may be arranged on the movable body 20. The first and second electrodes 401 and 402 may be provided on the surface 11 of the fixed body 10, whereas the third and fourth electrodes 403 and 404 may be provided on the surface 21 of the movable body 20. For example, the first to fourth electrodes 401, 402, 403, and 404 may be arranged in the form of a letter "X." That is, in a plane coordinate system having a reference position R as an origin, the first and second electrodes 401 and 402 may be arranged in the first and third quadrants, whereas the third and fourth electrodes 403 and 404 may be arranged in the second and fourth quadrants.

Figure 20:
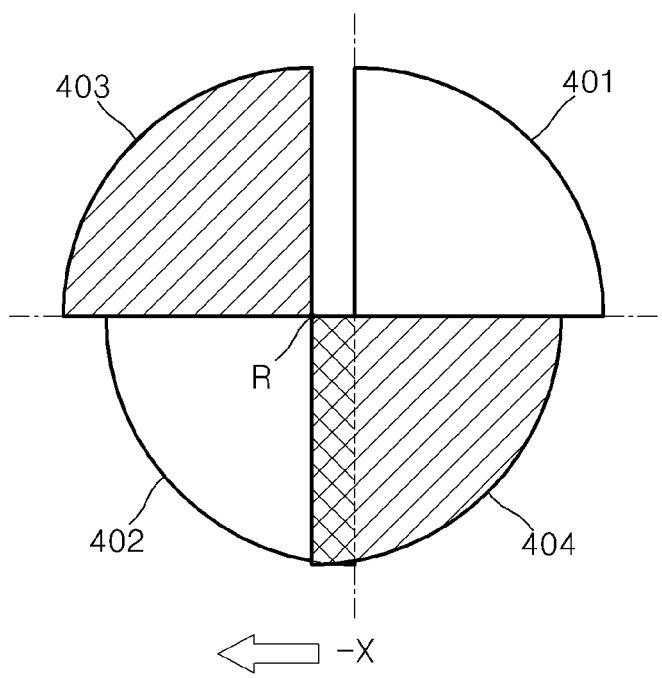
FIG. 20 illustrates an arrangement of electrodes when a movable body moves in a direction −X in the displacement detector of FIG. 19, according to an exemplary embodiment of the present inventive concept.

For example, when the movable body 20 is moved in an –X direction as illustrated in FIG. 20, the second and fourth electrodes 402 and 404 face each other with respect to a vertical direction. Air, for example, exists between the second and fourth electrodes 402 and 404. Thus, the second and fourth electrodes 402 and 404 form a capacitor. The capacitance of a capacitor formed by the second and fourth electrodes 402 and 404 is proportional to a size of an overlapping area between the second and fourth electrodes 402 and 404 facing each other. Thus, a displacement of the movable body 20 in the –X direction may be detected by detecting a change in the capacitance between the second and fourth electrodes 402 and 404. Although not illustrated in the drawings, when the movable body 20 is moved in a +X direction, the first and third electrodes 401 and 403 are arranged to face each other with respect to a vertical direction, forming a capacitor. Thus, a displacement of the movable body 20 in the +X direction may be detected by detecting a change in the capacitance between the first and third electrodes 401 and 403.

Likewise, when the movable body 20 is moved in a –Y direction, a displacement of the movable body 20 in the –Y direction may be detected by detecting a change in the capacitance between the second and third electrodes 402 and 403. When the movable body 20 is moved in a +Y direction, a displacement of the movable body 20 in the +Y direction may be detected by detecting a change in the capacitance between the first and fourth electrodes 401 and 404.

Referring to FIGS. 21A to 21D, when the reference position R exists in the first quadrant as illustrated in FIG. 21A, the first electrode 401 faces the third and fourth electrodes 403 and 404. When the reference position R exists in the second quadrant as illustrated in FIG. 21B, the fourth electrode 404 faces the first and second electrodes 401 and 402. When the reference position R exists in the third quadrant as illustrated in FIG. 21C, the second electrode 402 faces the third and fourth electrodes 403 and 404. When the reference position R exists in the fourth quadrant as illustrated in FIG. 21D, the third electrode 403 faces the first and second electrodes 401 and 402. Thus, a displacement of the movable body 20 in a certain direction may be detected by detecting a change in the capacitance between the facing electrodes.

Figure 21:
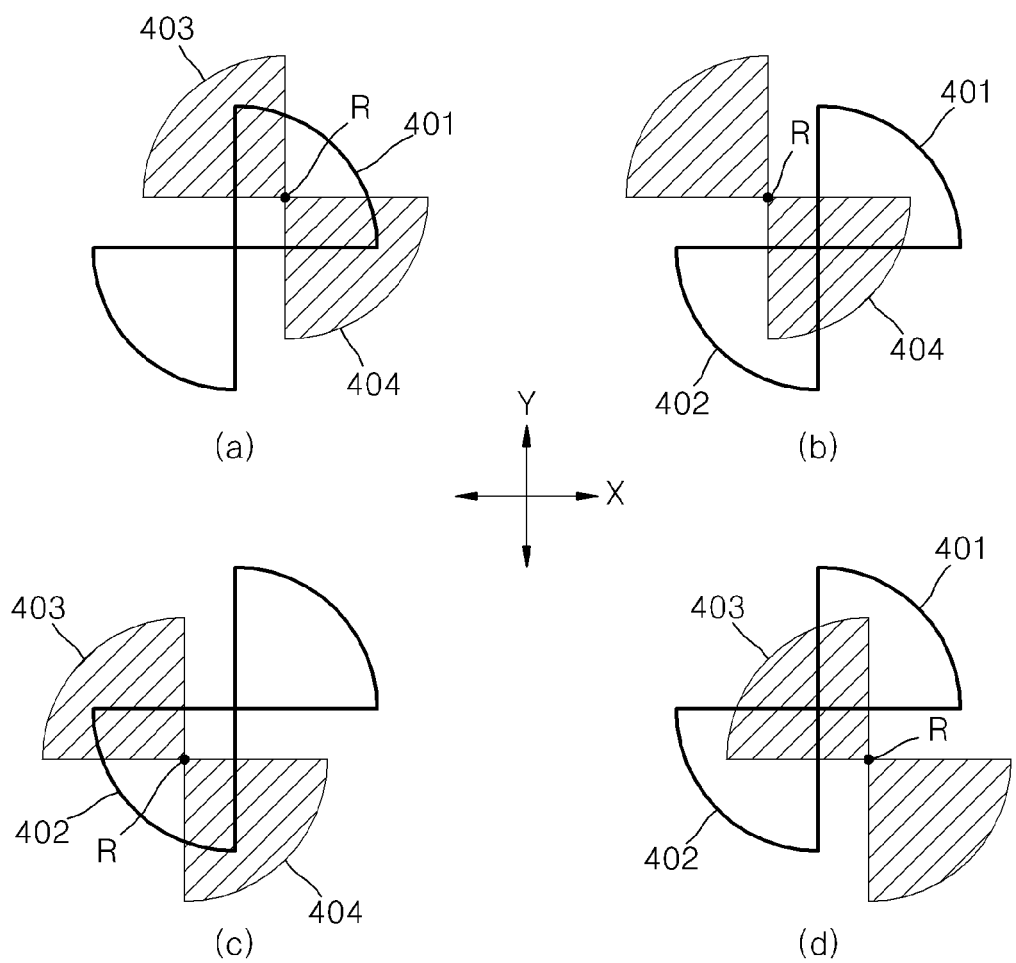
FIGS. 21a, 21b, 21c and 21d illustrate an arrangement of electrodes according to a position of a movable body in the displacement detector of FIG. 19, according to an exemplary embodiment of the present inventive concept.

The shapes of the first to fourth electrodes 401, 402, 403, and 404 are not limited to those illustrated in FIGS. 19 to 21. The first to fourth electrodes 401, 402, 403, and 404 may be embodied to have shapes suitable for the detection of a translational motion considering the shape of a piezoelectric actuator and the arrangement of piezoelectric elements. Also, the number of electrodes is not limited to 4.

The translational displacement detector having the shape of FIG. 19 may be applied to detect a tilt angle of the movable body 20 in a piezoelectric actuator for allowing the movable body 20 of FIG. 12 to have a tilt motion. In this case, since a distance between the opposed electrodes with an area between the opposed electrodes facing each other varies, a change of capacitance may be detected.

A tilt angle of the movable body 20 may be calculated based on a displacement detected by the translational displacement detector. In FIG. 12, the surface 11 of the fixed body 10 is formed to be a curved shape which corresponds to the surface 22 of the movable body 20 and thus the distance between the opposed electrodes may not be changed.

Figure 22:
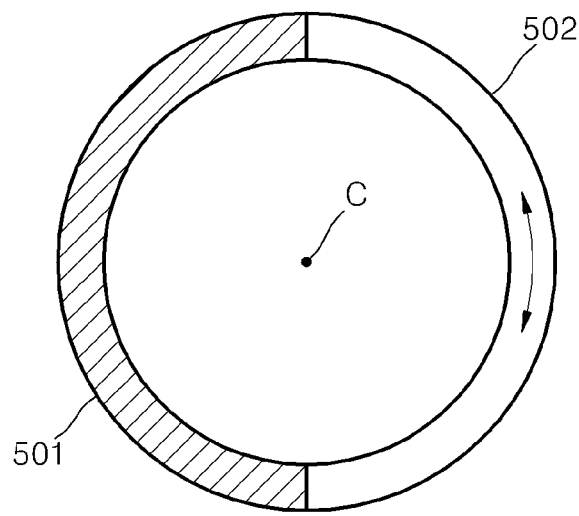
FIG. 22 illustrates a structure of a displacement detector which detects a rotational displacement of a movable body, according to an exemplary embodiment of the present inventive concept.

A capacitance type rotational displacement detector which detects a displacement of a rotational motion of the movable body 20 may be provided in the piezoelectric actuator capable of allowing the movable body 20 of FIG. 14 to have a rotational motion. For example, referring to FIG. 22, a first electrode 501 having a semicircular strap shape is provided on the surface 11 of the fixed body 10 of FIG. 1; whereas a second electrode 502 having a semicircular strap shape is provided on the surface 21 of the moveable body 20 and corresponding thereto. As the movable body 20 rotates, the area between the first and second electrodes 501 and 502 facing each other is changed. That is, as the movable body 20 starts to rotate, the capacitance gradually increases. When the first and second electrodes 501 and 502 are completely overlapped with each other and the movable body 20 continues to rotate, the capacitance gradually decreases. Thus, a rotational displacement of the movable body 20 may be detected by detecting a change in the capacitance between the first and second electrodes 501 and 502 according to the rotation of the movable body 20.

Figure 23:
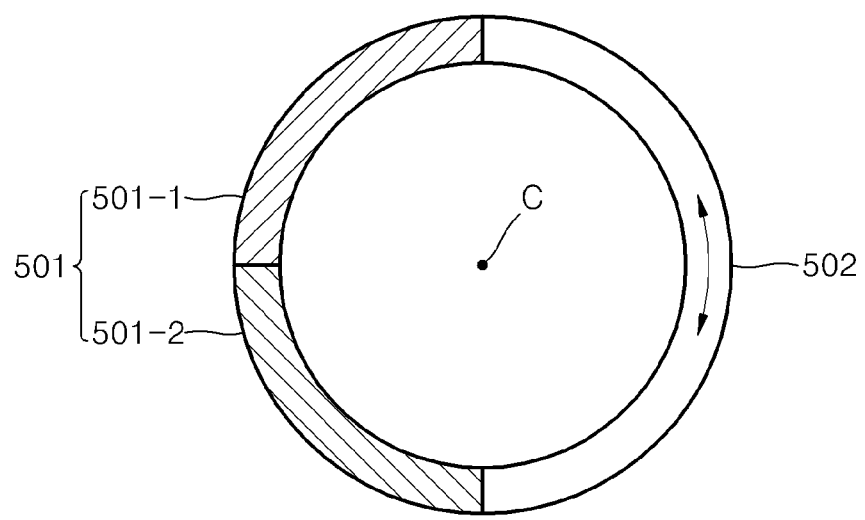
FIG. 23 illustrates a structure of a displacement detector which detects a rotational displacement of a movable body, according to another exemplary embodiment of the present inventive concept.

To detect a rotational direction, for example, the first electrode 501 may be divided into two. Referring to FIG. 23, the first electrode 501 may include first and second divided electrodes 501-1 and 501-2.

When the movable body 20 rotates in a clockwise direction, the capacitance between the second divided electrode 501-2 and the second electrode 502 first increases. After the capacitance between the second divided electrode 501-2 and the second electrode 502 reaches the maximum value, the maximum capacitance between the second divided electrode 501-2 and the second electrode 502 is maintained and the capacitance between the first divided electrode 501-1 and the second electrode 502 increases. After the capacitance between the first divided electrode 501-1 and the second electrode 502 reaches the maximum value, the maximum capacitance between the first divided electrode 501-1 and the second electrode 502 is maintained and the capacitance between the first divided electrode 501-1 and the second electrode 502 decreases. Next, the capacitance between the first divided electrode 501-1 and the second electrode 502 decreases.

When the movable body 20 rotates in a counterclockwise direction, the capacitance between the first divided electrode 501-1 and the second electrode 502 first increases. After the capacitance between the first divided electrode 501-1 and the second electrode 502 reaches the maximum value, the maximum capacitance between the first divided electrode 501-1 and the second electrode 502 is maintained and the capacitance between the second divided electrode 501-2 and the second electrode 502 increases. After the capacitance between the second divided electrode 501-2 and the second electrode 502 reaches the maximum value, the maximum capacitance between the second divided electrode 501-2 and the second electrode 502 is maintained and the capacitance between the first divided electrode 501-1 and the second electrode 502 decreases. Next, the capacitance between the second divided electrode 501-2 and the second electrode 502 decreases.

Table 1 is a summary of the above processes. Table 1 shows the rotational direction of the movable body 20 and a rotational displacement of the movable body 20 may be seen by tracing a process of changing capacitance

TABLE 1

|  |  | Capacitance between the $1^{st}$ divided electrode and the $2^{nd}$ electrode | | | |
| --- | --- | --- | --- | --- | --- |
|  |  | 0 | Increase | Maximum | Decrease |
| Capacitance between the $2^{nd}$ divided electrode and the $2^{nd}$ electrode | 0 | — | CCW | — | CW |
|  | Increase | CW | — | CCW | — |
|  | Maximum | — | CW | — | CCW |
|  | Decrease | CCW | — | CW | — |

In addition to the above-described method, a displacement detector may be configured by a resistance method using a change in resistance according to a translational displacement or rotational displacement of the fixed body 10 and the movable body 20. In this case, the displacement detector may include a resistance pattern provided on at least one of the fixed body 10 and the movable body 20, and a probe for connecting the fixed body 10 and the resistance pattern and/or the movable body 20 and the resistance pattern. As the movable body 10 moves, a contact position between the probe and the resistance pattern changes. Accordingly, the resistance of an electric circuit connecting the probe and the resistance pattern is changed. Thus, the displacement of the movable body 20 may be detected by detecting the change in resistance. In addition, the displacement detector may be implemented as a rotary encoder or a linear encoder.

Figure 24:
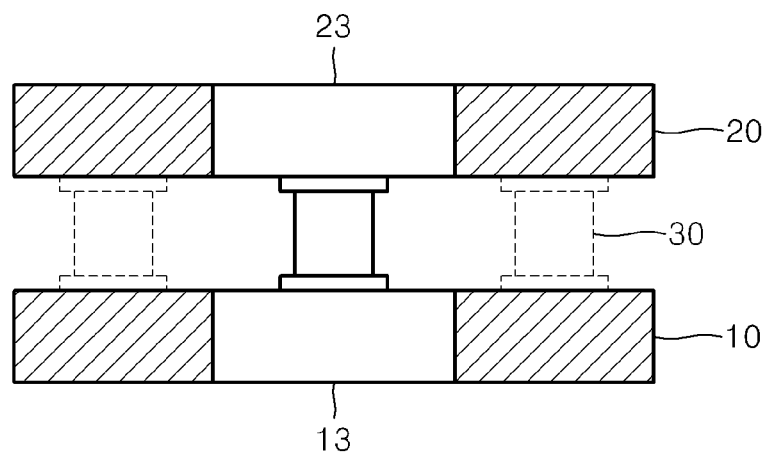
FIG. 24 is a cross-sectional view of a slip-stick piezoelectric actuator in which a through portion is provided in a center portion thereof.

FIG. 24 illustrates a piezoelectric actuator according to another exemplary embodiment of the present inventive concept. Referring to FIG. 24, through portions 13 and 23 are provided in the fixed body 10 and the movable body 20, respectively. The through portions 13 and 23 may be formed to communicate with each other and by penetrating the center portions of the fixed body 10 and the movable body 20. According to the above-described structure, other constituent elements of an apparatus employing a piezoelectric actuator may be moved through the through portions 13 and 23. When a piezoelectric actuator is applied to optical equipment, light may pass through the through portions 13 and 23. Thus, a degree of freedom in an apparatus employing a piezoelectric motor may be improved.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A piezoelectric actuator comprising:
    a fixed body;
    a movable body arranged to face the fixed body;
    a plurality of piezoelectric elements arranged between the fixed body and the movable body and operating in a shearing mode, each of the plurality of piezoelectric element having one end fixed to the fixed body and another end contacting the movable body; and
    a displacement detector which detects a displacement of the movable body, wherein the displacement detector comprises a plurality of electrodes arranged on surfaces of the movable body and the fixed body facing each other,
    wherein each of the plurality of piezoelectric element comprises first and second piezoelectric devices, and a direction of polarization of the first piezoelectric device and a direction of polarization of the second piezoelectric device are perpendicular to each other.

2. The piezoelectric actuator of claim 1, wherein at least one of the first and second piezoelectric devices comprises a first piezoelectric layer and a second piezoelectric layer having opposite directions of polarization.

3. The piezoelectric actuator of claim 2, wherein the first and second piezoelectric layers are stacked upon each other.

4. The piezoelectric actuator of claim 1, wherein the first and second piezoelectric devices are stacked upon each other.

5. The piezoelectric actuator of claim 1, wherein the movable body is pressed against the plurality of piezoelectric elements by at least one of self-weight, an elastic force, and a magnetic force.

6. The piezoelectric actuator of claim 1, wherein a surface of the movable body contacting the plurality of piezoelectric elements is a flat surface.

7. The piezoelectric actuator of claim 1, being capable of having a translational motion and a rotational motion by a slip-stick operation between the plurality of piezoelectric elements and the movable body.

8. The piezoelectric actuator of claim 1, wherein a surface of the movable body contacting the at least one piezoelectric element is a curved surface, and the movable body has a tilt motion from the plurality of piezoelectric elements.

9. The piezoelectric actuator of claim 8, wherein a support portion for supporting the at least one piezoelectric element in a tangential direction of the curved surface is provided on the fixed body.

10. A piezoelectric actuator comprising:
a fixed body;
a movable body arranged to face the fixed body;
a plurality of piezoelectric elements arranged between the fixed body and the movable body and operating in a shearing mode, each piezoelectric element having one end fixed to the fixed body and another end contacting the movable body; and
a displacement detector which detects a displacement of the movable body, wherein the displacement detector comprises a plurality of electrodes arranged on surfaces of the movable body and the fixed body facing each other,
wherein a direction of polarization of each of the plurality of piezoelectric elements is different from each other, each of the plurality of piezoelectric elements comprises a first piezoelectric layer and a second piezoelectric layer, a direction of polarization of the first piezoelectric layer and a direction of polarization of the second piezoelectric layer are perpendicular to each other, and at least one of the fixed body and the movable body comprises a through portion.

11. The piezoelectric actuator of claim 10, wherein one of a direction of polarization of the first piezoelectric layer and a direction of polarization of the second piezoelectric layer extends in a radial direction or in a direction perpendicular to the radial direction.

12. The piezoelectric actuator of claim 10, being capable of having a translational motion by a slip-stick operation between the plurality of piezoelectric elements and the movable body.

13. The piezoelectric actuator of claim 10, wherein the movable body is pressed against the plurality of piezoelectric elements by at least one of self-weight, an elastic force, and a magnetic force.

14. The piezoelectric actuator of claim 1, wherein the plurality of piezoelectric elements are radially arranged with respect to a center point.

15. The piezoelectric actuator of claim 14, wherein the first piezoelectric device comprises a first piezoelectric layer and a second piezoelectric layer having opposite directions of polarization in a radial direction such that the movable body has a translational motion by driving the first piezoelectric device.

16. The piezoelectric actuator of claim 15, wherein the second piezoelectric device comprises a third piezoelectric layer and a fourth piezoelectric layer having opposite directions of polarization in a direction perpendicular to the radial direction such that the movable body has a rotational motion by driving the second piezoelectric device.

17. The piezoelectric actuator of claim 16, wherein the first and second piezoelectric devices are stacked upon each other, the first and second piezoelectric layers are stacked upon each other, and the third and fourth piezoelectric layers are stacked upon each other.

18. The piezoelectric actuator of claim 17, wherein a surface of the movable body contacting the plurality of piezoelectric elements is a flat surface.

19. The piezoelectric actuator of claim 17, wherein a surface of the movable body contacting the plurality of piezoelectric elements is a curved surface, and the movable body has a tilt motion by driving the first piezoelectric device.

20. A slip-stick piezoelectric actuator for generating a fine displacement of an object, the slip-stick piezoelectric actuator comprising:
a fixed body;
a movable body arranged to face the fixed body;
a plurality of piezoelectric elements arranged between the fixed body and the movable body and operating in a shearing mode, each piezoelectric element having one end fixed to the fixed body and another end contacting the movable body; and
a displacement detector which detects a displacement of the movable body, wherein the displacement detector comprises a plurality of electrodes arranged on surfaces of the movable body and the fixed body facing each other,
wherein a direction of polarization of each of the plurality of piezoelectric elements is different from each other, and
wherein upon providing a drive signal to the piezoelectric elements in which a voltage is sharply changed deformation of the piezoelectric elements overcome the inertia of the movable body and slips over the surface of the movable body, and
wherein upon providing a drive signal to the piezoelectric elements in which a voltage is gradually changed the piezoelectric elements gradually return to their original state, whereby a fine displacement of an object is obtained.

* * * * *